(12) United States Patent
Kruit

(10) Patent No.: US 7,868,307 B2
(45) Date of Patent: Jan. 11, 2011

(54) CHARGED PARTICLE BEAM EXPOSURE SYSTEM

(75) Inventor: Pieter Kruit, Eb Delflt (NL)

(73) Assignee: Mapper Lithography IP B.V., CJ Delft (NL)

( * ) Notice: Subject to any disclaimer, the term of this patent is extended or adjusted under 35 U.S.C. 154(b) by 259 days.

(21) Appl. No.: 12/288,877

(22) Filed: Oct. 24, 2008

(65) Prior Publication Data

US 2009/0065711 A1    Mar. 12, 2009

Related U.S. Application Data

(62) Division of application No. 11/118,162, filed on Apr. 29, 2005, now Pat. No. 7,453,075.

(60) Provisional application No. 60/572,287, filed on May 17, 2004.

(51) Int. Cl.
*G21K 5/10* (2006.01)
*H01J 49/00* (2006.01)

(52) U.S. Cl. .............................. 250/492.22; 250/492.1; 250/492.2; 250/492.3

(58) Field of Classification Search ................ None
See application file for complete search history.

(56) References Cited

U.S. PATENT DOCUMENTS

| | | | | |
|---|---|---|---|---|
| 3,715,580 A * | 2/1973 | Maekawa et al. | ........... | 250/397 |
| 3,952,228 A * | 4/1976 | Reader et al. | .......... | 315/111.81 |
| 4,684,848 A * | 8/1987 | Kaufman et al. | ....... | 315/111.81 |
| 4,996,441 A * | 2/1991 | Lischke | ................... | 250/492.2 |
| 5,012,105 A * | 4/1991 | Ando et al. | ................. | 250/398 |
| 5,363,021 A * | 11/1994 | MacDonald | ................ | 315/366 |
| 5,616,926 A * | 4/1997 | Shinada et al. | ........... | 250/423 F |
| 6,566,664 B2 | 5/2003 | Muraki | | |
| 6,614,035 B2 * | 9/2003 | Hartley | .................. | 250/492.23 |
| 6,710,361 B2 * | 3/2004 | Pfeiffer et al. | ......... | 250/492.23 |
| 6,734,428 B2 * | 5/2004 | Parker et al. | ................... | 850/9 |
| 6,771,013 B2 * | 8/2004 | Magera et al. | .............. | 313/336 |
| 6,787,780 B2 * | 9/2004 | Hamaguchi et al. | ......... | 250/398 |
| 6,825,480 B1 * | 11/2004 | Watanabe et al. | ........ | 250/491.1 |
| 6,844,550 B1 * | 1/2005 | Yin et al. | ....................... | 850/9 |
| 6,870,171 B2 * | 3/2005 | Hosoda et al. | ......... | 250/492.22 |

(Continued)

FOREIGN PATENT DOCUMENTS

WO    WO 01/48787    7/2001

(Continued)

*Primary Examiner*—David A Vanore
(74) *Attorney, Agent, or Firm*—Blakely, Sokoloff, Taylor & Zafman

(57) ABSTRACT

A charged particle beam exposure apparatus for transferring a pattern onto a surface of a target, comprising a beam generator comprising a plurality of n changed particle sources, substantially in one plane, each source adapted for generating a charged particle beam, a first aperture array, comprising a plurality of groups of apertures, each group of apertures aligned with one source, for splitting each beam up into a plurality of beamlets m, thus resulting in a total of n×m beamlets, and a deflector array, comprising a plurality of groups of deflectors, each group of deflectors aligned with one source and one group of apertures, each deflector in a group aligned with an aperture of the corresponding group, and each group of deflectors operable for asserting a collimating influence on its corresponding beam.

11 Claims, 2 Drawing Sheets

U.S. PATENT DOCUMENTS

| | | | |
|---|---|---|---|
| 6,897,458 B2 * | 5/2005 | Wieland et al. | 250/494.1 |
| 6,946,665 B2 * | 9/2005 | Muraki et al. | 250/492.1 |
| 6,965,153 B1 * | 11/2005 | Ono et al. | 257/448 |
| 6,989,546 B2 * | 1/2006 | Loschner et al. | 250/492.22 |
| 7,064,477 B2 * | 6/2006 | Magera et al. | 313/336 |
| 7,084,414 B2 * | 8/2006 | Wieland et al. | 250/492.23 |
| 2001/0032939 A1 | 10/2001 | Gerlach | |
| 2003/0001095 A1 | 1/2003 | Lo | |
| 2003/0178583 A1 | 9/2003 | Kampherbeek | |
| 2003/0209676 A1 * | 11/2003 | Loschner et al. | 250/492.2 |
| 2004/0188636 A1 | 9/2004 | Hosoda | |

FOREIGN PATENT DOCUMENTS

| | | |
|---|---|---|
| WO | WO 2004/081910 | 9/2004 |

* cited by examiner

CHARGED PARTICLE BEAM EXPOSURE SYSTEM

The present patent application is a Divisional claiming the benefit of non-provisional application Ser. No. 11/118,162 filed Apr. 29, 2005, now U.S. Pat. No. 7,453,075 which application claims the priority of Provisional Application No. 60/572,287, filed May 17, 2004.

BACKGROUND

Several kinds of charged particle beam exposure systems are known in the art. Most of these systems are provided to transfer very precise patterns onto an exposure surface of a substrate. Since lithography features are pushed to become smaller and smaller following Moore's law, the high resolution of electron beams could be used to continue the drive to even smaller features than today.

A conventional Gaussian charged particle beam exposure apparatus has a throughput of about 1/100 wafer/hr. However, for lithography purposes a commercially acceptable throughput of at least a few wafers/hr is necessary. Several ideas to increase the throughput of such an apparatus have been proposed.

U.S. Pat. Nos. 5,760,410 and 6,313,476 for instance, disclose a lithography system using an electron beam having a cross section, which is modified during the transferring of a pattern to an exposure surface of a target. The specific cross section or shape of the beam is established during operation by moving the emitted beam inside an aperture by using electrostatic deflection. The selected aperture partially blanks and thereby shapes the electron beam. The target exposure surface moves under the beam to refresh the surface. In this way a pattern is written. The throughput of this system is still limited.

In US-A1-20010028042 US-A1-20010028043 and US-A1-20010028044 an electron beam lithography system is disclosed using a plurality of electron beams by using a plurality of emitters or sources, each emitter provided for generating one electron beamlet. Each beamlet is then individually shaped and blanked to create a pattern on the underlying substrate. As all these emitters have slightly different emission characteristics, homogeneity of the beamlets is a problem. This was corrected by levelling every individual beam current to a reference current. Correction values for the mismatch are extremely difficult to calculate and it takes a significant amount of time, which reduces the throughput of the system. This especially turns problematic when using up to about 13.000 beamlets.

In GB-A1-2.340.991, a multibeam particle lithography system is disclosed having a single source illumination system, which produces a plurality of charged particle sub-beams. The illumination system uses either a single ion source with aperture plates for splitting a beam in sub-beams, or a plurality of sources each producing a beam which is focused and projected. In general, the sources disclosed do not have a sufficient brightness.

In Jpn. J. Appl. Phys. Vol. 34 (1995) 6689-6695 a multi-electron beam ('probes') lithography system is disclosed having a single, specific ZrO/W-TFE thermal emission source with an emitter tip immersed in a magnetic field. The source has sufficient brightness, but a disadvantage of such a source is its limited total current. Furthermore, this source needs a crossover. The mutual homogeneity of the 'probes' is not further discussed. Furthermore, the intensity of the source is a not sufficient for about 13,000 beamlets.

In practise, many different approaches were proposed for multi-beam exposure systems. In one approach, one single source is used. The beam resulting from this source is split into many beamlets. In this approach, one single collimator lens is used. This approach has several drawbacks. For one, a large collimator lens suffers from aberrations. Furthermore, it proved difficult to obtain a single source which is at the same time very bright and has sufficient total emission current for a large number of beamlets.

In another approach, instead of the single collimator lens, the beam of a single source is split into a plurality of beamlets. Each beamlet is then individually deflected in such a way that substantially parallel beamlets are obtained. This will lead to large deflection angles for some of the beamlets and thus very difficult engineering challenges. Furthermore, again, it proved difficult to obtain a single source which is at the same time very bright and has sufficient total emission current for a large number of beamlets.

In yet another approach, n sources and n collimator lenses are used. A disadvantage of this approach is that is difficult to obtain the required number of beamlets per area of surface of the substrate: lenses for charged particle beams usually have a diameter which is about 10 times larger than the diameter of a beam. The different groups of beamlets will thus be spread over a large surface area.

SUMMARY OF THE INVENTION

It is an objective of the current invention to improve the performance of known charged particle beam exposure apparatus.

Another objective is to improve the resolution of known charged particle beam exposure apparatus.

Yet another objective of the current invention is to improve throughput of known charged particle beam exposure apparatus.

Yet another objective of the current invention is to overcome the problems related to Coulomb interactions and the demagnification methods in the prior art.

Another objective of the current invention is to simplify controlling uniformity of beamlets, especially during writing.

The invention relates to a charged particle beam exposure apparatus for transferring a pattern onto a surface of a target, comprising:
 a beam generator comprising a plurality of n changed particle sources, substantially in one plane, each source adapted for generating a charged particle beam;
 a first aperture array, comprising a plurality of groups of apertures, each group of apertures aligned with one source, for splitting each beam up into a plurality of beamlets m, thus resulting in a total of n×m beamlets, and
 a deflector array, comprising a plurality of groups of deflectors, each group of deflectors aligned with one source and one group of apertures, each deflector in a group aligned with an aperture of the corresponding group, and each group of deflectors operable for asserting a collimating influence on its corresponding beam.

In this way, it is possible to illuminate a large area with a sufficient beam current in each beamlet whilst avoiding the problems relating to aberration of collimator, which amongst others relate to the nature of lenses for charged particle beams, and aberrations due to these lenses. Furthermore, it is possible to provide sufficient beamlets per area on the surface of a target.

A large throughput can be obtained by illuminating a large area at a time by using many beamlets. In the approach of the invention, homogeneity and at the same time generating sufficient current per area at the target is possible. Furthermore, when using several sources for together illuminating a large area of up to 26×26 mm, the required opening angle problems can be overcome.

In an embodiment, in each charged particle beam has a beam axis and each group of deflectors has a centre which is aligned with a beam axis. In a further embodiment, each deflector of a group of deflectors is operable for deflecting charged particles towards the centre of the group of deflectors. In yet a further embodiment thereof, each deflector in a group of deflectors is adapted for asserting a force on charged particles which is equivalent to its distance from the centre of the group.

In another embodiment, said first aperture array is located before said deflector array.

In another embodiment, the apparatus of the invention further comprises a second aperture array, comprising a plurality of groups of apertures, each group of apertures aligned with a group of deflectors and each aperture aligned with a deflector, and said second aperture array located after said deflector array, wherein preferably the area of each of the second apertures is smaller than the area of the first apertures.

In another embodiment of the invention in the apparatus of the invention the inter-beamlet distance, being the distance between beamlets of a group, is about equal to the inter-group distance, being the distance between the nearest beams of neighbour groups.

In an embodiment thereof, an apparatus with beamlets which have a diameter at the surface of a substrate which is smaller than about 100 nm, in practice even smaller than 20 nm, the inter-beamlet distance will be about 100-200 micron. In such an embodiment, the distance between sources of a beam generator will be about 1-2 mm.

In another embodiment, the apparatus further comprises a lens array comprising a plurality of groups of lenses, each group of lenses aligned with a group of deflectors and each lens aligned with a deflector for receiving a beamlet, wherein each lens is operable for focussing a beamlet to a cross section smaller than 100 nm on the surface of the target.

Many of the features described in this document may be combined.

In another embodiment, the charged particle source is an electron source, such as a schottky emitter. In an embodiment thereof, said source comprises an array of tips coated with work-function-lowering material, and at least one heater for heating said tips. In an embodiment thereof, said source further comprises at least one reservoir for work-function-lowering material, arranged for allowing work-function-lowering material to diffuse from said reservoir to said tips. These tips can be regularly arranged in said array, and said tips have a radius of about 100-2000 nm.

The invention further pertains to an electron beam generator for generating a plurality of electron beams, said electron beam generator comprising a plurality of Schottky emitters substantially regularly arranged in one plane, each emitter comprising a tip coated with work-function-lowering material, at least one heater for heating said emitters, and at least one reservoir for work-function-lowering material, arranged for allowing work-function-lowering material to diffuse from said reservoir to said tips.

In particular, each emitter can be composed as described in PCT/NL2004/00112 of the same applicant, which document is enclosed herewith as if fully set forth.

Such a beam generator is in particular suited for the apparatus described above.

The invention further pertains to a method for transferring a pattern onto a target exposure surface, using an apparatus described above, and to a wafer processed using the apparatus of the current invention. The apparatus can furthermore be used for the production of mask, like for instance used in state-of-the-art optical lithography systems.

BRIEF DESCRIPTION OF THE DRAWINGS

The invention will be further elucidated in the following embodiments of an electron beam exposure apparatus according to the current invention, in which.

DESCRIPTION OF EMBODIMENTS

Figure 1:
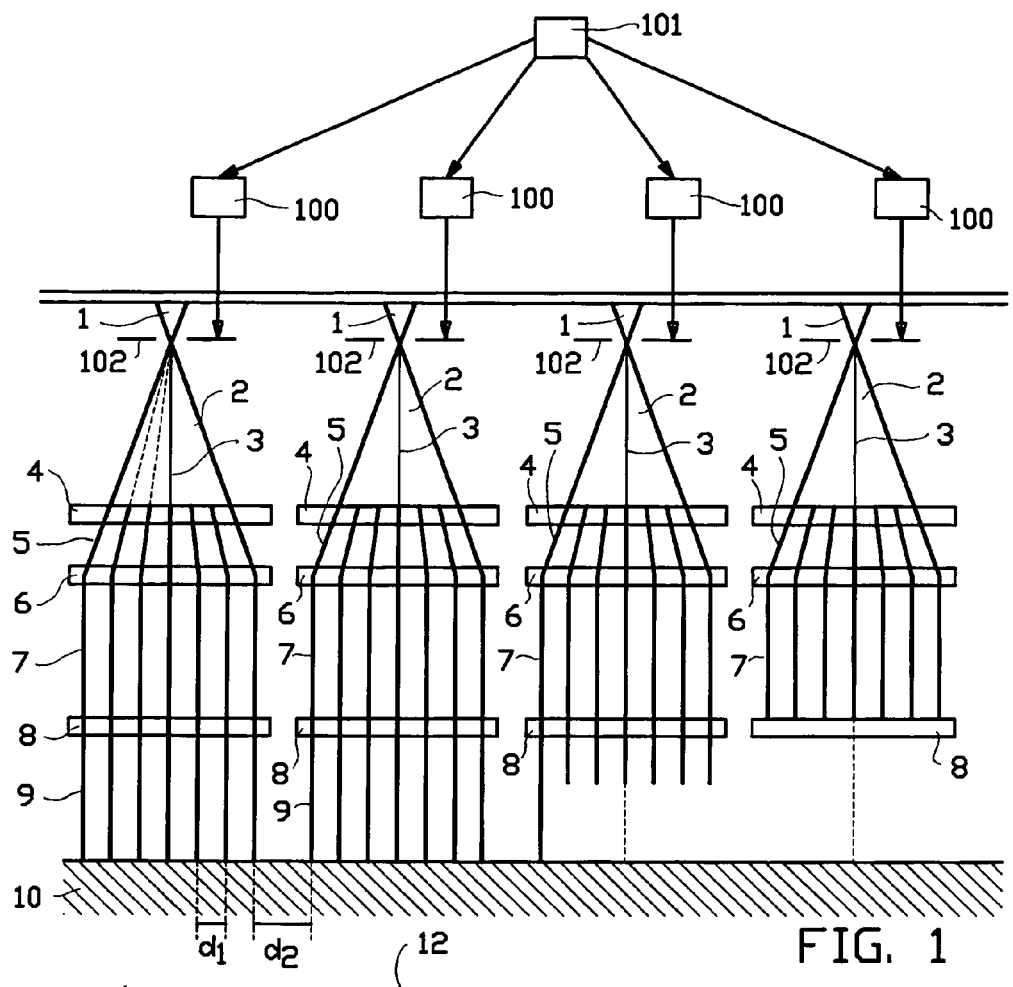
FIG. 1 shows an apparatus according to the present invention.

An embodiment of the present invention is schematically shown in FIG. 1. Electrons are emitted from several electron sources 1. The beam generator of the device has sources 1, each source 1 emitting an electron beam.

An illumination system (4, 6, 8) focuses and collimates each of the emitted electron beams 2 to illuminate a desired area on an aperture plate or aperture plates 4 uniformly.

The illumination system can be combined with all the features described in applicants co-pending patent applications U.S. 60/453,745 of Mar. 10, 2003 U.S. Ser. No. 10/600, 953 of Jun. 20, 2003 U.S. Ser. No. 10/692,632 of Oct. 24, 2003 U.S. 60/491,475 of Jul. 30, 2003, and U.S. 60/473,810 of May 28, 2003 U.S. Ser. No. 10/699,246 of Oct. 30, 2003 or family members or continuations of these US patent applications, which are all incorporated by reference as if fully set forth. All the devices, combinations thereof and specific elements, in most cases described for single beam systems, can be used in the current system.

In the system of the current invention, in an embodiment, one aperture array 4, one collimator 6 and one focussing lens array 8 can be used. All these devices can have their specific elements divided in groups, each group arranged to work on one beam 2.

In another embodiment, each beam can have its own set of devices (4, 6, 8), and these devices can be aligned with its proper beam in order to optimise performance.

In FIG. 1, each emitter or emitting source 1 produces a diverging beam 2 with an optical axis 3. In the embodiment of FIG. 1, each beam has the following optical system, which is, as explained above, one example of a possible (charged particle) optical system.

In the optical system of FIG. 1, each beam is provided with a group of beam splitters 4, for providing a group of beamlets 5. Each group of beamlets is provided with a collimator 6. In an embodiment, the collimator comprises a group of deflectors. The group of deflectors together have a collimating influence on the group of beamlets 5. The means that after the collimator, the optical axes of the beamlets 7 are substantially parallel.

After the collimator, the apparatus is provided with groups of lens arrays 8 one group for each group of beamlets, for focussing each beamlet to a cross section smaller than 100 nm on the substrate 10. In FIG. 1, the inter-beamlet distance is indicated with d1, and the inter-group distance is indicated with d2. In a preferred embodiment, d2 is about the same as d1. In an embodiment of the invention, the beamlets in a group are arranged in a hexagonal arrangement. These hexagonal groups can easily be stitched together in a close packing.

The system of FIG. 1 further has an extraction electrode 102 for each source. Each extraction electrode is operated by an operator 100. The system further has a controller 101 for controlling the operators 100 in such a way that the intensity and current density of each source 1 is controlled. The system may further be provided with measuring devices (not shown) for measuring the intensity and/or current density of each source 1. The measuring devices provide input to the controller 101.

Figure 2:
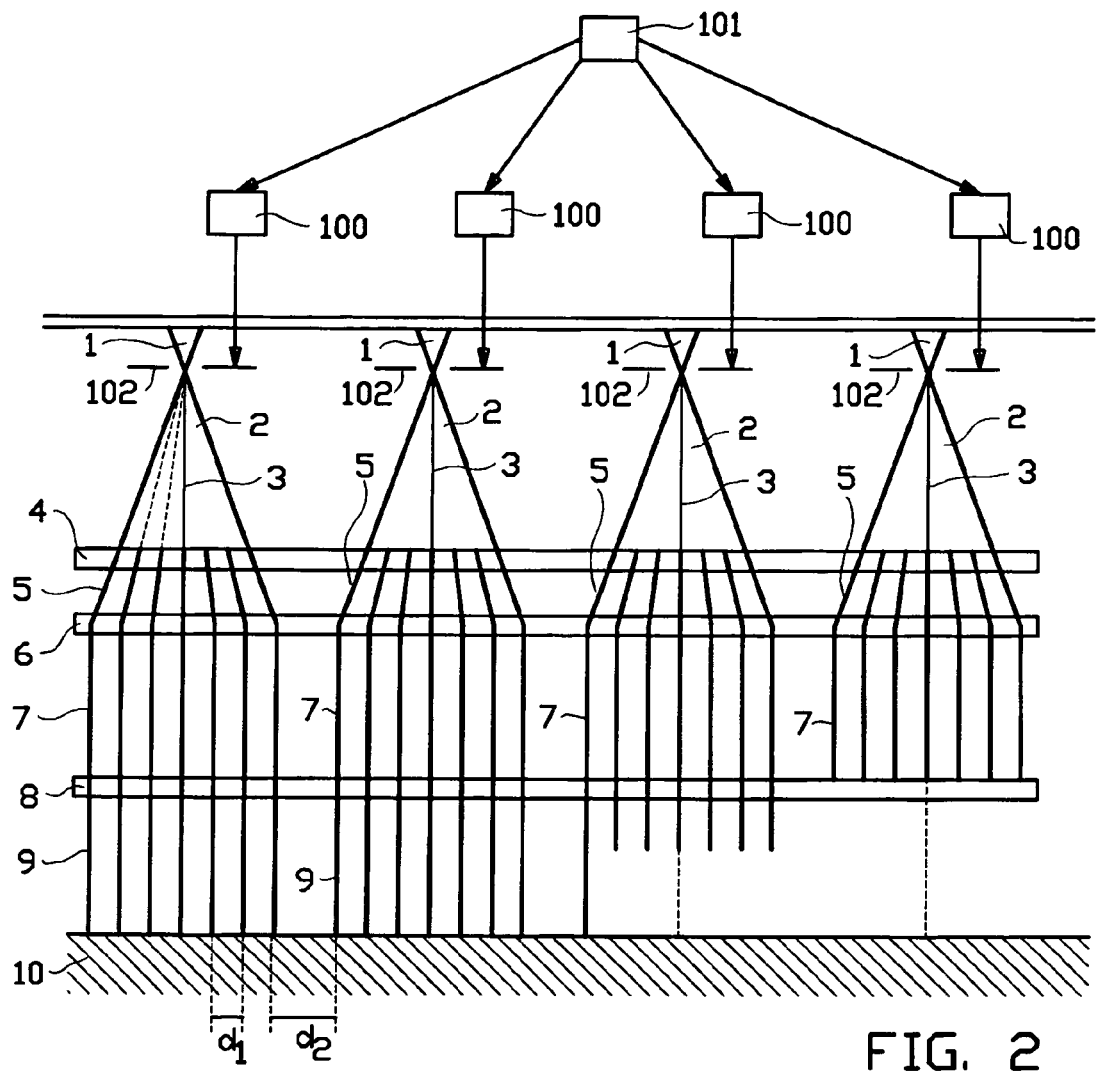
FIG. 2 shows another embodiment of an apparatus according to the present invention.

In FIG. 2 another embodiment of the system of the invention is shown. In this embodiment, beam splitter groups 4, collimator groups 6 and lens array groups 6 are each attached to one another. In an embodiment these devices are each provided on a single plate. In a further embodiment, these plates can be integrated by for instance attaching these plates to one another. These plates can for instance be produced from a (silicon) wafer which is etched and processed using well-know techniques and procedures.

Figure 3:
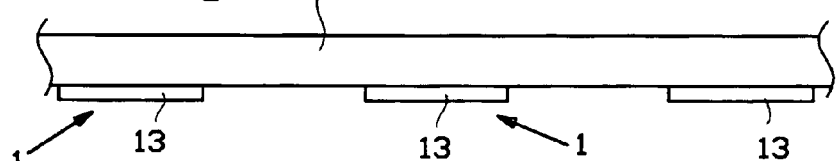
FIG. 3 shows an electron source according to another aspect of the invention.
Figure 4:
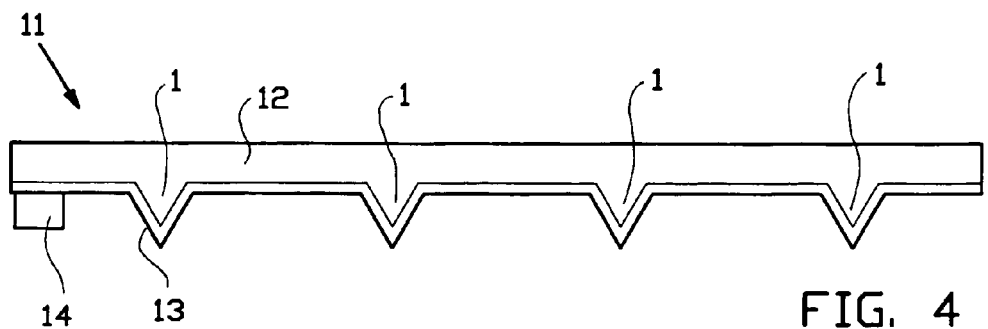
FIG. 4 shows another embodiment of an electron source according to another aspect of the invention.

In the present invention, a combination of sources, thus providing a source as shown in FIGS. 3 and 4, may be used. Preferably, an array of separate Schottky emitters is used, as indicated in FIGS. 1 and 2.

In an embodiment shown in FIG. 3, the electron source has various sources 13 on one single substrate 12. The sources typically deliver 1000 A/cm$^2$ from an area of about 0.1-2 micron squared. In an embodiment, thermionic sources are used. The electrons are preferably emitted in the space charge limited emission regime in order to benefit from a homogenizing effect of the space charge. Examples of such a source are a $LaB_6$ crystal, a dispenser source comprising Barium Oxide, or a dispenser source comprising a layer of Barium or Tungsten covered with a mixture comprising Scandium Oxide or a source comprising crystalline tungsten 12 with areas of zirconium oxide 13, acting as sources.

In a preferred embodiment, shown in FIG. 4, a dispenser source is used comprising for instance a Tungsten substrate 12 with crystalline tungsten tips 1 as sources, regularly spaced, covered with a layer 13 of Zirconium Oxide of a functionally similar substance. The beam generator 11 furthermore comprises a reservoir 14 of this material. In another embodiment a $LaB_6$ substrate 12 with crystalline $LaB_6$ tips 1 as sources, regularly spaced, is used.

In another embodiment, several of the sources described in PCT/NL2004/00112 are regularly spaced in an array in order to provide the sources of the current invention.

It is to be understood that the above description is included to illustrate the operation of the preferred embodiments and is not meant to limit the scope of the invention. From the above discussion, many variations will be apparent to one skilled in the art that would yet be encompassed by the spirit and scope of the present invention.

What is claimed is:

1. A method for transferring a pattern onto a target exposure surface comprising:
    generating a plurality of n charged particle beams (3) utilizing a beam generator, wherein each charged particle beam (3) has a beam axis (2);
    splitting each beam (3) of said n charged particle beams into a plurality of m beamlets (5), thus resulting in a total of n×m beamlets (5), said splitting being accomplished by a first aperture array (4), comprising a plurality of groups of apertures, each group of apertures aligned with one of said n charged particle beams (3); and
    deflecting said m beamlets (5) of each beam (3) utilising a deflector array comprising a plurality of groups of deflectors, each group of deflectors has a centre which is aligned with the beam axis (2) of one beam (3) of said n charged particle beams, wherein each deflector of a group of deflectors is operable for deflecting charged particles towards the centre of the group of deflectors.

2. The method according to claim 1, wherein each group of deflectors is aligned with one beam (3) and one group of apertures, each deflector in a group is aligned with an aperture of the corresponding group.

3. The method according to claim 2, wherein each deflector in a group of deflectors is operable for asserting a force on charged particles which is equivalent to its distance from the centre of the group.

4. The method according to claim 1, wherein said first aperture array is located before said deflector array.

5. The method according to claim 1, wherein said deflectors are operable for directing said beamlets towards an aperture of a second aperture array or not, comprising a plurality of groups of apertures, each group of apertures aligned with a group of deflectors and each aperture aligned with a deflector, and said second aperture array located after said deflector array.

6. The method according to claim 1, wherein each beamlet (5) is focussed to a cross section smaller than 100 nm on the surface of the target utilising a lens array comprising a plurality of groups of lenses, each group of lenses aligned with a group of deflectors and each lens aligned with a deflector for receiving a beamlet.

7. The method according to claim 1, wherein the beam generator comprises a plurality of n charged particle sources (1), substantially in one plane, wherein each source (1) is utilised for generating one beam (3) of said n charged particle beams.

8. The method according to claim 7, wherein the charged particle source (1) is an electron source.

9. The method of claim 1, utilising a first aperture array situated on a single substrate.

10. The method of claim 1, utilising a deflector array situated on one single substrate.

11. The method of claim 1, utilising a deflector array and an aperture array situated on one single substrate.

* * * * *